(12) United States Patent
Chen et al.

(10) Patent No.: US 7,779,522 B2
(45) Date of Patent: Aug. 24, 2010

(54) METHOD FOR FORMING A MEMS

(75) Inventors: Zhenfang Chen, Cupertino, CA (US); Jeffrey Birkmeyer, San Jose, CA (US)

(73) Assignee: FUJIFILM Dimatix, Inc., Lebanon, NH (US)

( * ) Notice: Subject to any disclaimer, the term of this patent is extended or adjusted under 35 U.S.C. 154(b) by 501 days.

(21) Appl. No.: 11/744,124

(22) Filed: May 3, 2007

(65) Prior Publication Data

US 2007/0259468 A1    Nov. 8, 2007

Related U.S. Application Data

(60) Provisional application No. 60/746,598, filed on May 5, 2006.

(51) Int. Cl.
*H01L 41/22* (2006.01)
*H01L 41/00* (2006.01)

(52) U.S. Cl. .......................... 29/25.35; 29/830; 29/831; 29/832; 29/846; 310/311

(58) Field of Classification Search ............... 29/25.35, 29/830, 831, 832, 846; 438/60, 75, 48, 109, 438/52, 372, 455; 310/328, 340; 156/240, 156/361
See application file for complete search history.

(56) References Cited

U.S. PATENT DOCUMENTS

| 5,376,857 | A | 12/1994 | Takeuchi et al. |
|---|---|---|---|
| 6,204,079 | B1 * | 3/2001 | Aspar et al. .................... 438/25 |
| 6,664,126 | B1 | 12/2003 | Devoe et al. |
| 7,052,117 | B2 | 5/2006 | Bibl et al. |
| 2004/0031438 | A1 * | 2/2004 | Sung ........................... 117/68 |
| 2004/0104272 | A1 | 6/2004 | Figuet et al. |
| 2004/0226162 | A1 | 11/2004 | Miura et al. |
| 2005/0099467 | A1 | 5/2005 | Bibl et al. |
| 2005/0280675 | A1 | 12/2005 | Bibl et al. |
| 2006/0018796 | A1 | 1/2006 | Sitte |
| 2006/0082256 | A1 | 4/2006 | Bibl et al. |

FOREIGN PATENT DOCUMENTS

JP    10-264385    10/1998

OTHER PUBLICATIONS

Zhenfang Chen et al., "Polishing Piezoelectric Material", U.S. Appl. No. 11/744,105, filed May 3, 2007, 21 pp.
International Search Report and Written Opinion of the International Searching Authority, International Application Serial No. PCT/US07/68278, Oct. 16, 2007, 6 pp.

* cited by examiner

*Primary Examiner*—Derris H Banks
*Assistant Examiner*—Tai Nguyen
(74) *Attorney, Agent, or Firm*—Fish & Richardson P.C.

(57) ABSTRACT

Techniques are described for forming actuators having piezoelectric material. A block of piezoelectric material is bonded to a transfer substrate. The block is then polished. The polished surface is bonded to a MEMS body.

19 Claims, 5 Drawing Sheets

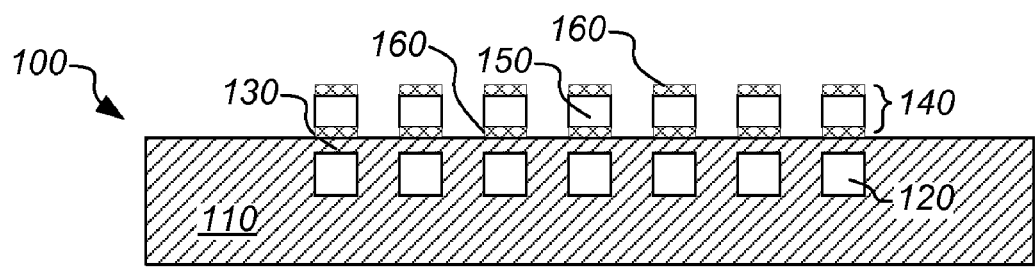
FIG._1
FIG._2
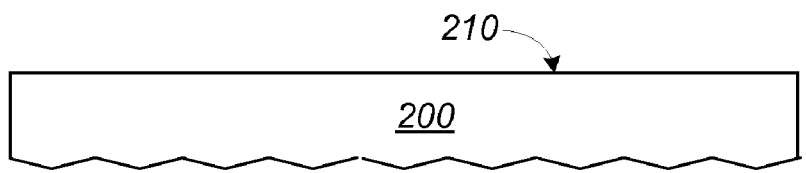
FIG._3
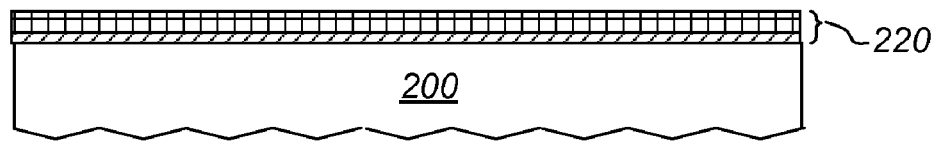
FIG._4

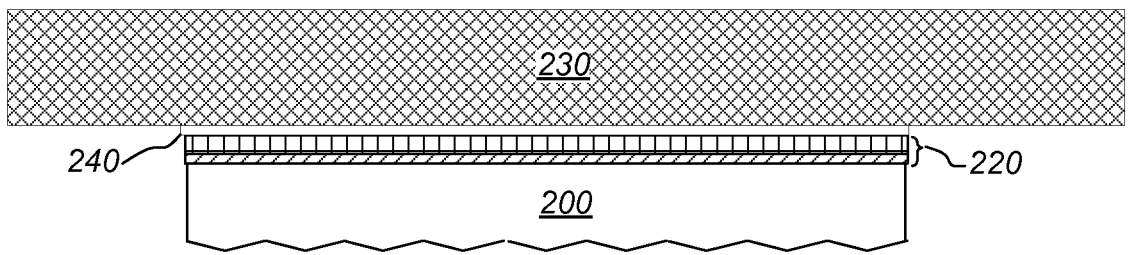
FIG._5
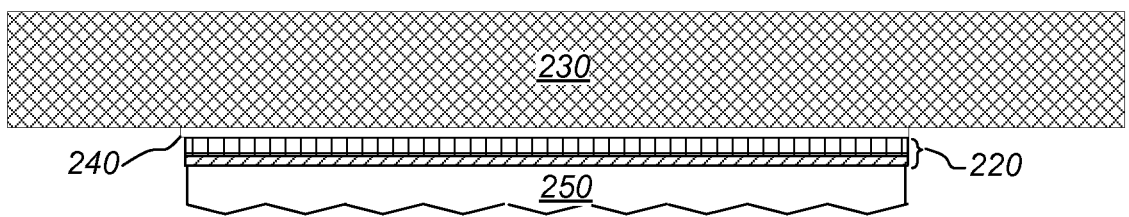
FIG._6
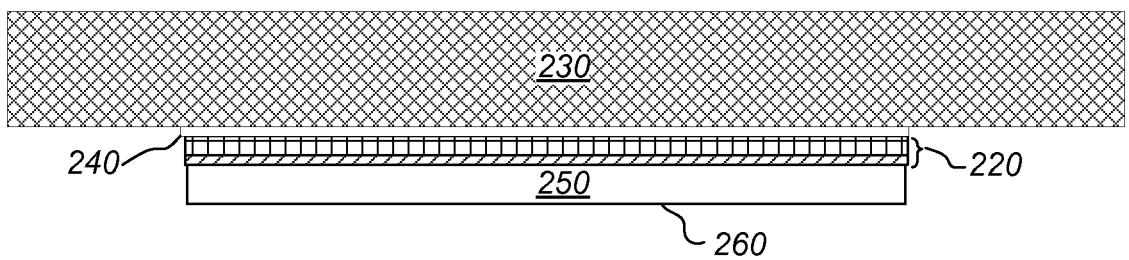
FIG._7
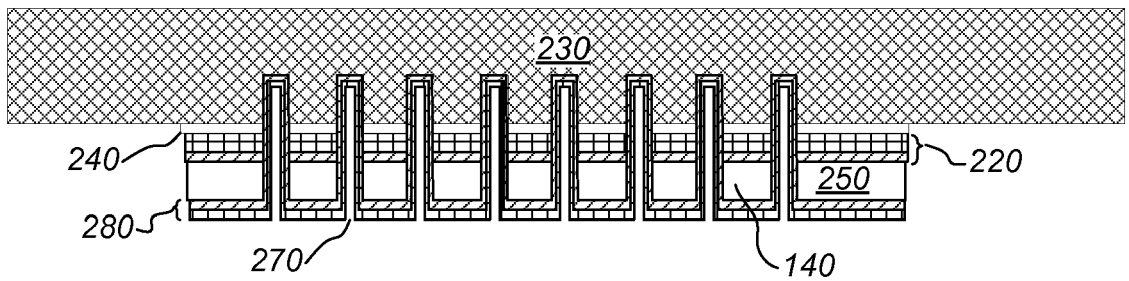
FIG._8

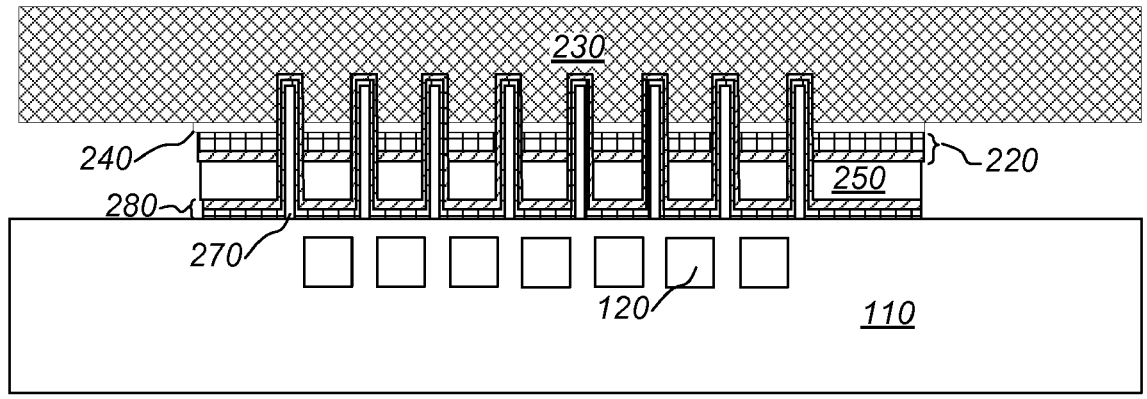
FIG._9
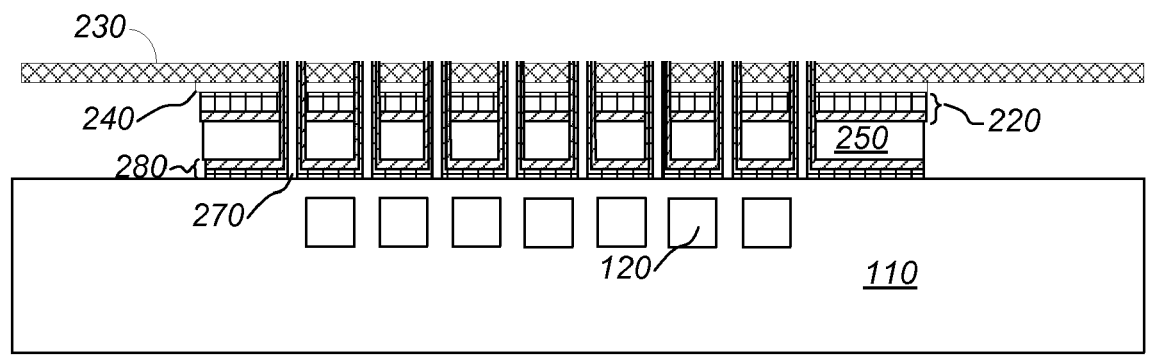
FIG._10

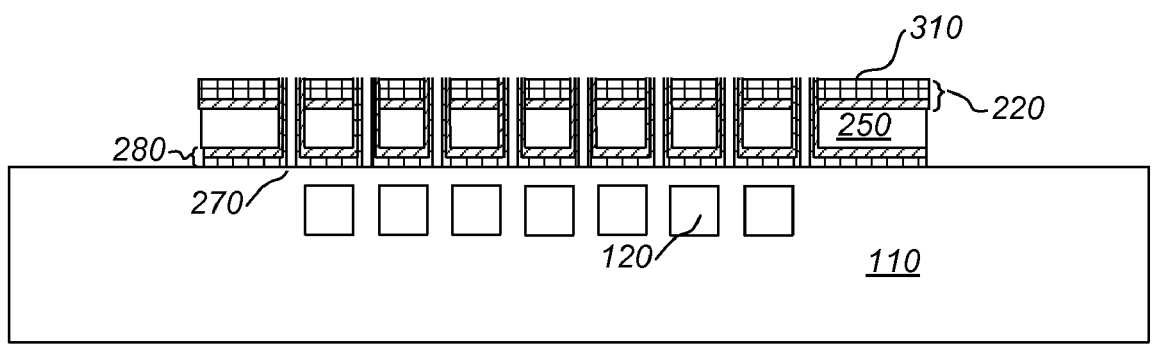
FIG._11
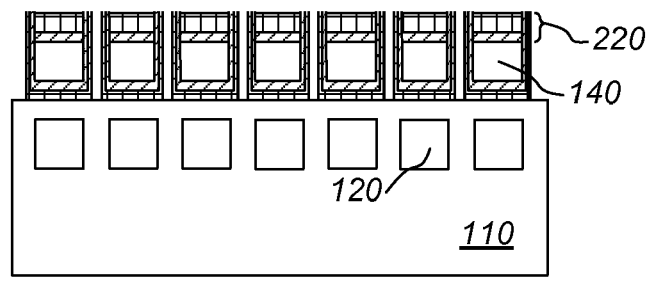
FIG._12

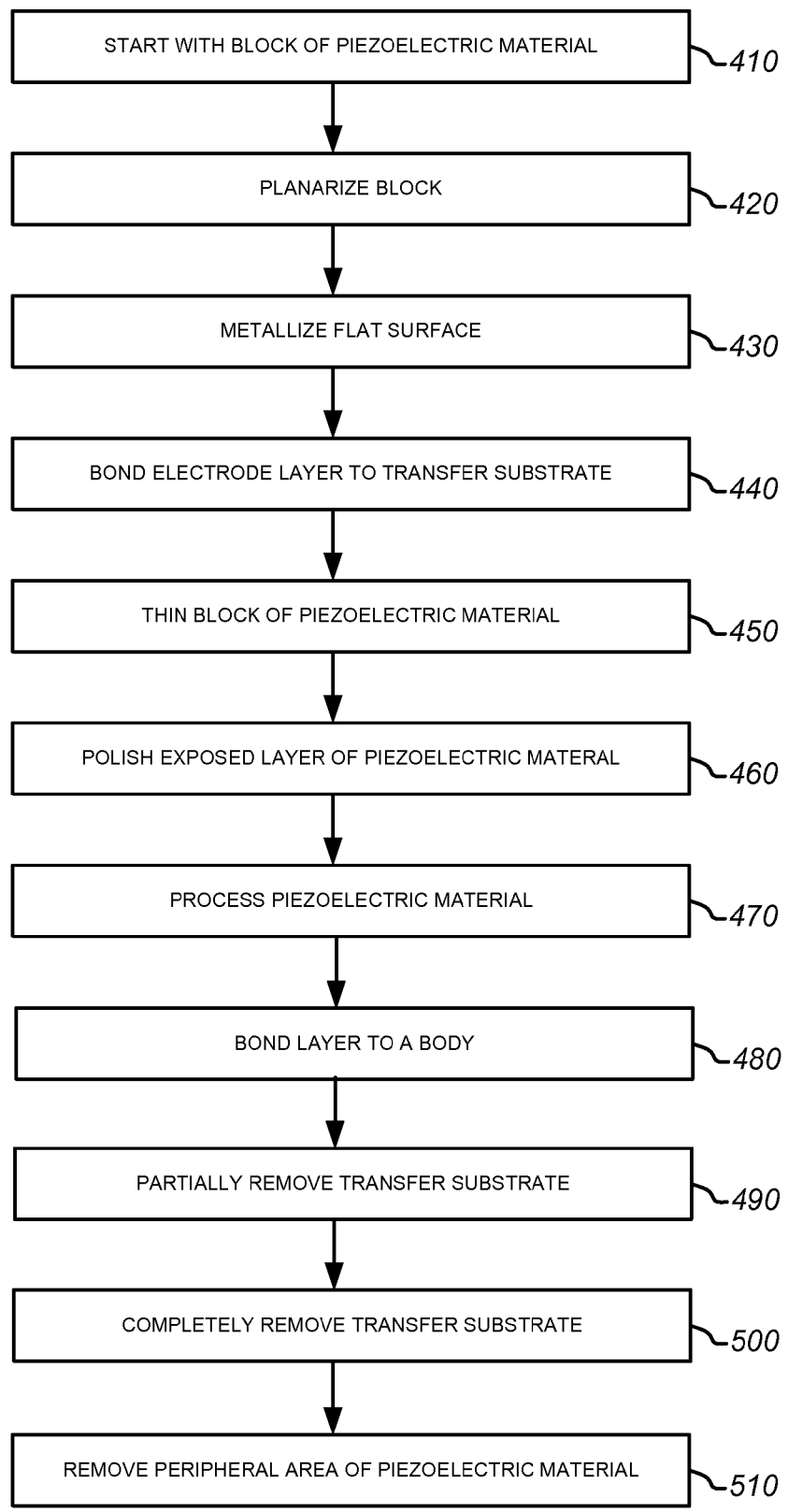
FIG._13

METHOD FOR FORMING A MEMS

CROSS-REFERENCE TO RELATED APPLICATIONS

This application claims priority to U.S. Provisional Application Ser. No. 60/746,598, filed on May 5, 2006. The disclosure of the prior application is considered part of and is incorporated by reference in the disclosure of this application.

BACKGROUND

This invention relates to processing piezoelectric material.

Piezoelectric materials can generate electricity or a voltage differential when subjected to mechanical stress. Alternatively, applying a voltage across a piezoelectric material can cause converse piezoelectricity, that is, the piezoelectric material mechanically deforms when a voltage is applied. Converse piezoelectricity can cause bending forces in the piezoelectric material that are extremely high. Both of these properties, generating electricity and converse piezoelectricity, are harnessed for use in electrical and mechanical devices, such as transducers, e.g., actuators and sensors. Multiple transducers, including a combination of actuators and sensors, can be combined together in a microelectromechanical system (MEMS).

A MEMS typically has mechanical structures formed in a semiconductor substrate using conventional semiconductor processing techniques. A MEMS can include a single structure or multiple structures. MEMS have an electrical component, where an electrical signal activates each or is produced by actuation of each structure in the MEMS.

One implementation of a MEMS includes a body having chambers formed in the body and a piezoelectric actuator formed on an exterior surface of the body. The piezoelectric actuator has a layer of piezoelectric material, such as a ceramic, and elements for transmitting a voltage, such as electrodes. The electrodes of the piezoelectric actuator can either apply a voltage across the piezoelectric material or transmit a voltage that is produced when the piezoelectric material is deformed.

SUMMARY

In one implementation, a method is described for forming a MEMS. A first surface of a layer of piezoelectric material is bonded to a transfer substrate. An exposed surface of the piezoelectric material is polished, the exposed surface opposes the first surface to form a polished surface. The polished surface is bonded to a MEMS body.

In another implementation, a method is described for forming a MEMS. A block of piezoelectric material is polished to form a flat surface. A conductive layer is applied on the flat surface. The conductive layer is bonded to a transfer substrate, leaving a surface opposed to the flat surface exposed. After bonding the conductive layer to the transfer substrate, the block of piezoelectric material is thinned. The surface opposed to the flat surface is polished. After polishing the surface opposed to the flat surface, the piezoelectric material is bonded to a body having chambers formed therein. The transfer substrate is removed.

Implementations of the embodiments may include one or more of the following features. Bonding a first surface of a layer of piezoelectric material to a transfer substrate can include adhering the first surface to the transfer substrate with a resin. Bonding the polished surface to a MEMS body can include adhering the polished surface to the MEMS body with a resin. The polishing can be chemical mechanical polishing. The transfer substrate can have a surface roughness of between about 1 and 10 Angstroms. The polished surface can have a surface roughness of between about 10 and 20 Angstroms. A conductive layer can be formed on the polished surface. The piezoelectric material can be cut prior to bonding the polished surface to the MEMS body. Part of the piezoelectric material can be ground away prior to polishing. The transfer substrate can be ground away and/or polished away. A surface of the piezoelectric material that is opposite to the polished surface can be polished. A conductive layer can be formed on a surface of the piezoelectric material that is opposite to the polished surface. Polishing the exposed surface can include polishing away at least about 4 microns or between about 4 and 10 microns from the piezoelectric material to remove damage.

The methods and devices described herein can provide one or more of the following advantages. Some processes, such as grinding, can damage the surface of piezoelectric material. Polishing can remove surface damage from the piezoelectric material. Removing damage from the surface of a thin layer of piezoelectric material, such as a material that is less than 20, 10 or 5 microns thick can remove cracks from the piezoelectric material. There is no limitation to the thinness of piezoelectric material that can be created from a bulk piece of piezoelectric material. With grinding, the thinness of the material can be limited to a thickness that is not damaged or not affected by damage such as under 10 microns. Polishing can also provide a surface with more homogenous piezoelectric characteristics. Thus, a polished piezoelectric actuator can behave uniformly along its length and/or width. A transfer substrate that holds the piezoelectric material during polishing can be very flat and can keep the total thickness variation across the substrate very low, which allows for uniformity of the piezoelectric thickness and response. If a layer of piezoelectric material is polished prior to being patterned, any roll off from the polishing process can be discarded form the edges of the piece. Thus, there is no roll-off on the tops of the individual piezoelectric features or islands.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a cross-sectional view of a MEMS.

FIGS. 2-12 are cross-sectional views from a process of forming actuators of a MEMS.

FIG. 13 is a flow diagram of the steps shown in FIGS. 2-12.

Like reference symbols in the various drawings indicate like elements.

DETAILED DESCRIPTION

Referring to FIG. 1, a MEMS 100 has a body 110 with chambers 120 covered by a membrane 130. Actuators 140 are associated with at least some of the chambers 120, that is, the actuators 140 are aligned with the chambers 120 so that when an actuator deforms, the actuator 140 pressurizes its corresponding chamber 120. The actuators 140 each include a portion formed of a piezoelectric material 150 and one or more electrodes 160. The membrane 130 is sufficiently flexible so that it bends when either the actuator 140 is activated or when the pressure inside the chamber 120 changes.

Referring to FIGS. 2 and 13, the actuators are prepared for the MEMS 100 by starting with a block 200 of piezoelectric material (step 410). The piezoelectric material can be a material having crystals that exhibit piezoelectricity, such as ceramics with perovskite or tungsten-bronze structures, or materials such as lead zirconate titanate (PZT) or lead magnesium niobate (PMN).

The block 200 is a pre-fired sheet of material, which does not require further curing. The block can have an initial working thickness of about 300-800 microns. In one implementation, the piezoelectric material is PZT and the PZT has a density of about 7.5 g/cm$^3$ or more, e.g., about 8 g/cm$^3$. The d31 coefficient can be about 200 or greater. Substrates of HIPS-treated piezoelectric material are available as H5C and H5D from Sumitomo Electric Industries, Osaka, Japan. The H5C material exhibits an apparent density of about 8.05 g/cm$^3$ and d31 of about 210. The H5D material exhibits an apparent density of about 8.15 g/cm$^3$ and a d31 of about 300. The Young's modulus of a pre-fired material can be around 70 gigapascals, while the Young's modulus of a sol gel piezoelectric material is typically between about 10 and 40 gigapascals.

Substrates are typically about 1 cm thick, and a block having the desired working thickness can be sawn from the substrate. The piezoelectric material can be formed by techniques including pressing, doctor blading, green sheet, sol gel or deposition. Piezoelectric material manufacture is discussed in Piezoelectric Ceramics, B. Jaffe, Academic Press Limited, 1971, the entire contents of which are incorporated herein by reference. Forming methods, including hot pressing, are described at pages 258-9. Single crystal piezoelectric material such as PMN, available from TRS Ceramics, Philadelphia, Pa., can also be used. Bulk PZT materials can have higher d coefficients, dielectric constants, coupling coefficients, stiffness and density than sputtered, screen printed or sol-gel formed PZT materials.

These properties can be established in a piezoelectric material by using techniques that involve firing the material prior to attachment to a body. For example, piezoelectric material that is molded and fired by itself (as opposed to on a support) has the advantage that high pressure can be used to pack the material into a mold (heated or not). In addition, fewer additives, such as flow agents and binders, are typically required. Higher temperatures, 1200-1300° C. for example, can be used in the firing process, allowing better maturing and grain growth. Unlike piezoelectric layers that are formed by sol gel or sputtering techniques, the grains in a bulk piezoelectric material can have a width of between about two and four microns. Firing atmospheres (e.g., lead enriched atmospheres) can be used to reduce the loss of PbO (due to the high temperatures) from the ceramic. The outside surface of the molded part that may have PbO loss or other degradation can be cut off and discarded. The material can also be processed by hot isostatic pressing (HIPs), during which the ceramic is subject to high pressures. The Hipping process can be conducted during firing or after a block of piezoelectric material has been fired, and is used to increase density, reduce voids and increase piezoelectric constants. The Hipping process can be conducted in an oxygen or oxygen/argon atmosphere.

Referring to FIGS. 3 and 13, the block 200 is planarized to achieve a flat surface 210 (step 420). Planarizing, or polishing, is performed with a chemical mechanical polishing (CMP) apparatus. CMP operates to remove material by chemically reacting with the material as well as by physically polishing away material. The CMP apparatus uses a rotating chuck that holds the material to be polished against a polishing surface. Additionally, a slurry is introduced between the polishing surface and the material to be polished. The slurry is a liquid with abrasive particles. Often, the chemical reaction in CMP polishing is dependent on the slurry that is selected. If the block 200 of piezoelectric material is formed of PZT, the polishing surface can be a hard polyurethane pad. The slurry can have silica particles and basic pH, such as a pH of 11. In some implementations, the slurry is P4217, from Fujimi, Co., located in Kiyosu, Japan. For other piezoelectric materials, other polishing pads or polishing liquid may be optimal for polishing. Approximately 4-10 microns of the exposed surface 210 can be polished away. Polishing away at least 4 microns removes surface damage, such as damage caused by grinding. A surface roughness of about 10-20 Angstroms can be achieved by polishing. In CMP polishing, roll off can occur at the edge of the layer being polished. That is, the edges can be polished at a different rate than the center of the material. To prevent the roll off from affecting the final tolerance across the layer of piezoelectric material, the edge portion of the material can be removed in a later step. In some implementations, the block of piezoelectric material has an area, e.g., in length and width directions, that is at least 1 cm greater than the final usable area of the piezoelectric material.

Referring to FIGS. 4 and 13, the polished flat surface 210 is metallized to form an electrode layer 220 (step 430). The electrode layer includes a conductive material, such as a layer of one or more metals. In some embodiments, a layer of titanium tungsten is applied to the flat surface 210. A layer of gold is then applied over the titanium tungsten. The titanium tungsten enables the gold layer to adhere to the block 200. Other conductive materials can be used instead of titanium tungsten and gold. The step of forming an electrode layer 220 is optional, depending on the type of actuator that is to be formed.

Referring to FIGS. 5 and 13, the electrode layer 220 is bonded to a transfer substrate 230 (step 440). The transfer substrate 230 has a very flat surface, such as a material with a flatness of less than 1 micron. Additionally, the transfer substrate may have a roughness of less than about 50 Angstroms, less than about 40 Angstroms, less than about 30 Angstroms or less than about 20 Angstroms, such as between about 10 and 20 Angstroms. In some embodiments, the transfer substrate is a semiconductor, such as silicon, e.g., single crystal silicon. A bonding material 240, such as a resin, for example an epoxy resin or polymerized benzocyclobutene (BCB), can be used to bond the electrode layer 220 to the transfer substrate 230. The piezoelectric material can be bonded to a material conventionally used in semiconductor processing, such as silicon or a silicon oxide. Alternatively, the piezoelectric material can be attached to another substrate, that is capable of having a flat surface as described above.

Referring to FIGS. 6 and 13, an optional step of thinning the block 200 of piezoelectric material is performed to form a layer 250 of piezoelectric material (step 450). The block 200 can be thinned by grinding. In horizontal grinding, a work piece is mounted on a rotating chuck having a reference surface machined to a high flatness tolerance. The exposed surface of the work piece is contacted with a horizontal grinding wheel, also in alignment at high tolerance. The grinding can produce flatness and parallelism of, e.g., about 0.5 microns or less, e.g., about 0.3 microns or less over a substrate. The grinding also produces a uniform residual stress. The layer can be thicker than the final thickness of the piezoelectric material after the assembly is complete, such as between about 2 and 100 microns, or between about 4 and 50 microns, or between about 8 and 20 microns thicker than the final thickness. Grinding processes can create surface damage of about 5 microns deep. The layer can be the thickness of the surface damage greater than the final desired thickness of the piezoelectric layer.

Referring to FIGS. 7 and 13, the exposed surface 260 of the layer 250 of piezoelectric material is polished (step 460). The polishing step can be similar to the previous polishing step described above in conjunction with FIG. 3.

Referring to FIGS. 8 and 13, the layer 250 of piezoelectric material is processed as required to form the actuators (step 470). In some embodiments, cuts 270 are formed in the layer 250 to separate adjacent actuators 140 from one another. The cuts 270 extend into the transfer substrate 230. The cuts enable islands of piezoelectric material to be formed for the completed MEMS. A conductive layer 280 is formed on the exposed surfaces of the layer 250. The conductive layer 280 includes a conductive material, such as one or more metals, such as titanium tungsten and gold. Such processing is described in U.S. application Ser. No. 10/967,073, filed Oct. 15, 2004, which is incorporated herein by reference for all purposes.

Referring to FIGS. 9 and 13, after any required processing in step 470, the layer 250 is bonded to a body 110 (step 480). The body 110 is the body of a MEMS and has chambers 120. The cuts 270 are aligned with locations in the body that are between the chambers 120. The layer 250 of piezoelectric material or the conductive layer 280, depending on whether there is a conductive layer 280, is bonded to the body 110. The bond can be made with an interlayer, that is, a bonding material, for example BCB, or without an interlayer, such as such as with a eutectic bond, or with direct bonding, such as is described in related U.S. application Ser. No. 11/744,105, filed May 3, 2007, which is incorporated by reference herein for all purposes.

Referring to FIGS. 10 and 13, the transfer substrate 230 is at least partially removed (step 490). The transfer substrate 230 can be removed by grinding. A thin layer of transfer substrate is left on the layer 250 of piezoelectric material.

Referring to FIGS. 11 and 13, the transfer substrate is completely removed by polishing (step 500). The polishing process can be highly selective, i.e., the polishing rate for the transfer substrate can be much higher than the polishing rate for the electrode layer 220. Thus, the polishing that removes the transfer substrate 230 is not effective on the metal. Thus, the electrode layer 220 acts a metal stop for the polishing process. If the transfer substrate 230 is formed of silicon, the polishing process can be similar to the process described above. However, a different slurry can improve the polishing results, such as 5FA, having silica particles and a pH of 7, from Fujimi. The resulting assembly of body 110, conductive layers 220, 280 and piezoelectric material layer 250 can form a partially completed or completed MEMS.

Optionally, the electrode layer 220 can be further processed to improve the electrode quality. In some embodiments, the electrode layer 220 is etched to remove conductive material from locations where the electrode is not desired. An upper electrode of a completed actuator may not cover the entire top surface of the piezoelectric islands. In some embodiments, a new layer of conductive material is added to the electrode layer 220, such as by sputtering a metal layer, to fill in any scratches. The conductive material can be applied through a mask or the conductive material can be etched to define the locations of electrodes. Alternatively, a layer of photoresist can be applied to the electrode layer 220 prior to applying the conductive material. The photoresist is then removed after the conductive material is applied, which lifts off unwanted conductive material. In some embodiments, all of the electrode layer 220 is stripped and a new electrode layer is applied.

In some embodiments, a periphery area 310 of the layer 250 of piezoelectric material remains after the transfer substrate 230 is removed. Referring to FIGS. 12 and 13, the periphery area 310 of piezoelectric material can be removed from the assembly, such as by cutting, dicing, or etching (step 510). The periphery area 310 can exhibit some amount of roll off due to the polishing process. That is, the polishing may be faster or slower at the edges of the layer 250 of the piezoelectric material. The compliancy of the polishing surface may also contribute to roll off. To promote uniformity amongst the actuators, the portions of piezoelectric material near the edges that are thinner or thicker than the center portion are removed. Where multiple MEMS are formed on a single assembly, the MEMS can be broken from the assembly into individual chips. The periphery portions 310 can be also removed at this step.

One or more of the steps described above can be eliminated from the method, while allowing the method to provide the same advantages. Also, the steps can be performed in a different order. Polishing a layer or a block of piezoelectric material prevents roll off from occurring on each of the individual actuators. The roll off may occur in an unused area of the piezoelectric material, but this portion can be removed before completing the MEMS device. The thickness uniformity of the polished piezoelectric material, or the total thickness variation (TTV), depends on the polishing process and on the flatness of the transfer substrate that holds the piezoelectric material during polishing. When the piezoelectric material is held by a transfer substrate with a very tight TTV, the piezoelectric material can be polished to have a tight TTV. A silicon substrate, can be polished to have a surface roughness (Ra) of about 1-10 Angstroms, such as across a six inch, an eight inch, or a twelve inch substrate. A piezoelectric layer that is held by a substrate that is polished to an Ra of 1-10 Angstroms can have an Ra value 10-20 Angstroms after polishing. If the piezoelectric material were polished after being applied to the body of the MEMS, and the body were formed of multiple layers of polished substrates, the TTV from each substrate would accumulate to cause the polished piezoelectric material to have a worse TTV, such as closer to 1 to 2 microns.

The membrane of the MEMS body is sufficiently compliant to transfer the actuator's bending to a corresponding chamber or vice versa. This compliancy can be due to the membrane being flexible or thin. If a piezoelectric material is first attached to the MEMS body and then ground, the grinding force can be too much for the membrane to withstand and can damage the membrane. If the piezoelectric material is ground to less than about 10 microns, the grinding force can damage the membrane. Using a transfer substrate as a holder for the piezoelectric material during grinding prevents causing damage to the membrane. Also, the transfer substrate provides a handle for manipulating the piezoelectric material. Moreover, if the piezoelectric material were attached to the MEMS during polishing, any debris or particles that may shed from the MEMS body can scratch the piezoelectric material. Some piezoelectric materials, such as PZT, are particularly soft and prone to scratching. A solid transfer substrate is less likely to shed particles than a processed MEMS body.

A number of embodiments of the invention have been described. Nevertheless, it will be understood that various modifications may be made without departing from the spirit and scope of the invention. Accordingly, other embodiments are within the scope of the following claims.

What is claimed is:

1. A method for forming a MEMS, comprising:
   bonding a first surface of a layer of piezoelectric material to a transfer substrate, wherein the transfer substrate has a surface roughness less than about 50 Angstroms;
   polishing an exposed surface of the piezoelectric material, on an opposite side of the layer from the first surface to form a polished surface; and
   bonding the polished surface to a MEMS body.

2. The method of claim 1, wherein bonding a first surface of a layer of piezoelectric material to a transfer substrate includes adhering the first surface to the transfer substrate with a resin.

3. The method of claim 1, wherein bonding the polished surface to a MEMS body includes adhering the polished surface to the MEMS body with a resin.

4. The method of claim 1, wherein the polishing is chemical mechanical polishing.

5. The method of claim 1, wherein the transfer substrate has a surface roughness of between about 1 and 10 Angstroms.

6. The method of claim 1, wherein the polished surface has a surface roughness of between about 10 and 20 Angstroms.

7. The method of claim 1, further comprising forming a conductive layer on the polished surface.

8. The method of claim 1, further comprising cutting the piezoelectric material prior to bonding the polished surface to the MEMS body.

9. The method of claim 1, further comprising grinding away part of the piezoelectric material prior to polishing.

10. The method of claim 1, further comprising grinding away the transfer substrate.

11. The method of claim 10, further comprising polishing away the transfer substrate.

12. The method of claim 10, further comprising polishing a surface of the piezoelectric material that is opposite to the polished surface.

13. The method of claim 1, further comprising forming a conductive layer on a surface of the piezoelectric material that is opposite to the polished surface.

14. The method of claim 1, wherein polishing the exposed surface includes polishing away at least about 4 microns from the piezoelectric material to remove damage.

15. The method of claim 1, wherein polishing the exposed surface includes polishing away between about 4 and 10 microns from the piezoelectric material to remove damage.

16. A method for forming a MEMS, comprising:
   polishing a block of piezoelectric material to form a flat surface;
   applying a conductive layer on the flat surface;
   bonding the conductive layer to a transfer substrate, leaving a surface opposed to the flat surface exposed, wherein the transfer substrate has a surface roughness less than about 50 Angstroms;
   after bonding the conductive layer to the transfer substrate, thinning the block of piezoelectric material;
   polishing the surface opposed to the flat surface;
   after polishing the surface opposed to the flat surface, bonding the piezoelectric material to a body having chambers formed therein; and
   removing the transfer substrate.

17. A method for forming a MEMS, comprising:
   bonding a first surface of a layer of piezoelectric material to a transfer substrate;
   polishing an exposed surface of the piezoelectric material, on an opposite side of the layer from the first surface to form a polished surface;
   bonding the polished surface to a MEMS body; and
   cutting the piezoelectric material prior to bonding the polished surface to the MEMS body.

18. The method of claim 17, wherein cutting the piezoelectric material further comprises cutting into the transfer substrate.

19. A method for forming a MEMS, comprising:
   bonding a first surface of a layer of bulk piezoelectric material to a transfer substrate;
   reducing a thickness of the layer of the bulk piezoelectric material to less than 20 microns;
   polishing an exposed surface of the piezoelectric material, on an opposite side of the layer from the first surface to form a polished surface; and
   bonding the polished surface to a MEMS body.

* * * * *